(12) United States Patent
Kadota

(10) Patent No.: US 6,326,645 B1
(45) Date of Patent: *Dec. 4, 2001

(54) SEMICONDUCTOR PHOTONIC DEVICE

(75) Inventor: Michio Kadota, Kyoto (JP)

(73) Assignee: Murata Manufacturing Co., Ltd. (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/385,808

(22) Filed: Aug. 30, 1999

(30) Foreign Application Priority Data

Sep. 4, 1998 (JP) .................................. 10-251639

(51) Int. Cl.$^7$ .................................................. H01L 29/12
(52) U.S. Cl. ........................... 257/94; 257/96; 257/103; 257/190; 257/200
(58) Field of Search ..................... 257/190, 200, 257/103, 43, 14, 15, 18, 22, 94, 96, 98

(56) References Cited

U.S. PATENT DOCUMENTS

| | | | |
|---|---|---|---|
| 5,815,520 | * | 9/1998 | Furushima ........................... 372/45 |
| 6,015,979 | * | 1/2000 | Sugiura et al. ........................ 257/86 |
| 6,045,626 | * | 4/2000 | Yano et al. ........................... 148/33.4 |
| 6,168,659 | * | 1/2001 | Yuri et al. ............................ 117/89 |

FOREIGN PATENT DOCUMENTS

| | | |
|---|---|---|
| 19931300A1 | 7/1999 | (DE) . |
| 8-075940 | 3/1996 | (JP) . |
| 8-083928 | 3/1996 | (JP) . |
| 08139361A | 5/1996 | (JP) . |
| 9-45960 | * 2/1997 | (JP) . |
| 9-045960 | 2/1997 | (JP) . |

OTHER PUBLICATIONS

"Growth of ZnO thin films on GaAs by pulsed laser deposition"; V. Craciun, et al.; *Thin Solid Films*; 259 (1995); 1–4.

"Properties of thick ZnO layers on oxidized silicon"; F. Moeller, et al.; 1994 Ultrasonics Symposium; vol. 1, 94 CH3468–6; ISSN: 1051–0117 Nov. 1–4, 1994; pp. 403–407.

* cited by examiner

*Primary Examiner*—Olik Chaudhuri
*Assistant Examiner*—Wai-Sing Louie
(74) *Attorney, Agent, or Firm*—Ostrolenk, Faber, Gerb & Soffen, LLP

(57) ABSTRACT

A semiconductor photonic device has a Si substrate; a SiO$_2$ film formed on the Si substrate; a ZnO film formed on the SiO$_2$ film; and a semiconductor compound layer represented by In$_x$Ga$_y$Al$_z$N (x+y+z=1, 0≦x≦1, 0≦y≦1, 0≦z≦1) formed on the ZnO film.

12 Claims, 3 Drawing Sheets

SEMICONDUCTOR PHOTONIC DEVICE

BACKGROUND OF THE INVENTION

1. Field of the Invention

The present invention relates to a semiconductor photonic device, and more particularly to a semiconductor photonic device comprising group III-V compound semiconductor, such as GaN, InGaN, GaAlN, InGaAlN.

2. Description of the Related Art

As a material for forming a semiconductor photonic device such as light emitting diode (LED) or laser diode (LD) for generating lights from a blue light through an ultraviolet light, there has been known a group III-V compound semiconductor represented by a general formula $In_xGa_yAl_zN$ ($x+y+z=1$, $0 \leq x \leq 1$, $0 \leq y \leq 1$, $0 \leq z \leq 1$). Since such kind of compound semiconductor is a direct transition type, it has a high light emitting efficiency. Further, since it is possible to control the wave length of a light being emitted by controlling In concentration, said compound semiconductor has attracted public attention.

Since it is difficult to manufacture a large scale single crystal by using the $In_xGa_yAl_zN$ when a film of such crystal is to be manufactured, a process called hetero-epitaxial growth is used to grow the crystal on substrates of different materials, in general, it is usual that the crystal is allowed to grow on a C surface sapphire substrate and a Si substrate.

However, since the C surface sapphire substrate and Si substrate do not have a matched lattice with the compound $In_xGa_yAl_z$, there is a problem that a large amount of crystal defects having a density of $10^8/cm^2 - 10^{11}/cm^2$ will occur in the crystals grown on the C surface sapphire or Si substrate. As a result, it is impossible to obtain a crystal film having a good quality and an excellent crystallinity.

Accordingly, it has been suggested that ZnO film be formed as a buffer film on the C surface sapphire substrate and Si substrate. Although it is possible to obtain a good quality ZnO orientated film with the light emitting element obtained by forming an $In_xGa_yAl_zN$ layer on the C surface sapphire substrate through ZnO film, there is a problem in that such a substrate has to be manufactured with a high cost. Further, with the light emitting element obtained by forming a $In_xGa_yAl_zN$ layer on the Si substrate through the ZnO film, although such a substrate can be manufactured with a low cost, there is another problem in that it is impossible to obtain a ZnO orientated film with a good quality, whereby it is further impossible to grow a $In_xGa_yAl_zN$ having an excellent crystallinity on the ZnO film.

SUMMARY OF THE INVENTION

The present invention is directed to a semiconductor photonic device which comprises an excellent $In_xGa_yAl_zN$ layer formed using a Si substrate. The semiconductor photonic device is characterized in that ZnO film is formed on Si substrate with $SiO_2$ film interposed therebetween so as to obtain a base substrate, a compound semiconductor layer represented by $In_xGa_yAl_zN$ ($x+y+z=1$, $0 \leq x \leq 1$, $0 \leq y \leq 1$, $0 \leq z \leq 1$) is formed on said base substrate.

According to the experiments conducted by the inventor of the present invention, when $SiO_2$ film was formed on Si substrate and ZnO film was formed on the $SiO_2$ film, it was able to obtain ZnO film having a good crystallinity. In particular, when the surface of Si substrate was thermally oxidized slightly and a $SiO_2$ film (thermally oxidized film) having a thickness of 100 Å is formed on the Si substrate, one could obtain ZnO film having a good crystallinity. In addition, even under a condition where the $SiO_2$ film has been formed on the surface of the Si substrate by means of a physical deposition such as sputtering, it was still able to obtain a ZnO film having a good crystallinity.

Therefore, according to the present invention, it is possible to grow a ZnO film having a good crystallinity on a cheap Si substrate, and it is also possible to grow an $In_xGa_yAl_zN$ crystal thereon with the ZnO film serving as a buffer layer. Thus, it has become possible to manufacture with a reduced cost a semiconductor photonic device of $In_xGa_yAl_zN$ series capable of emitting light from a blue light through an ultraviolet light.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, the preferred embodiments of the present invention are explained in detail with reference to the drawings.

Figure 1:
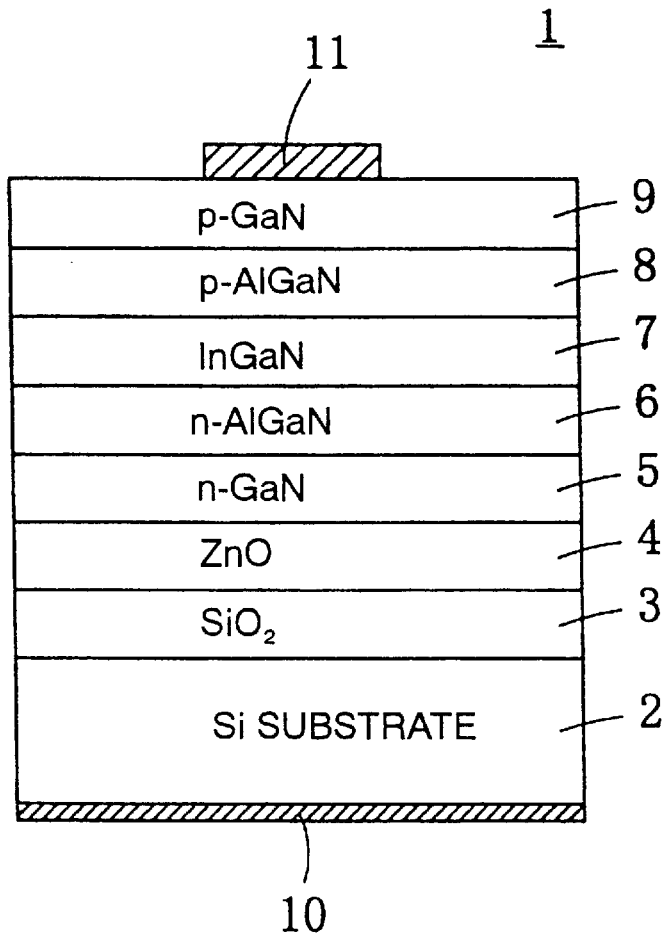
FIG. 1 is a cross sectional view schematically indicating a semiconductor photonic device according to a first embodiment of the present invention.

FIG. 1 is a cross sectional view schematically indicating a semiconductor photonic device 1 according to a first embodiment of the present invention. The semiconductor photonic device 1 may be a light emitting diode or a surface emitting type laser diode, each having an InGaN layer 7 serving as a luminescent layer. In detail, such a semiconductor photonic device 1 may be obtained by forming a $SiO_2$ film 3 having a thickness of about 1000 Å on a Si substrate 2 by virtue of thermal oxidation, followed by forming thereon a ZnO film 4 having a thickness of 3500 Å and having a low specific resistance. Next, by a method called epitaxial growth is used to successively form a n-type GaN layer 5, a n-type AlGaN layer 6, the InGaN layer (a luminescent layer) 7, a p-type AlGaN layer 8 and a p-type GaN layer 9. In this way, the n-type GaN layer 5, n-type AlGaN layer 6, InGaN layer 7, p-type AlGaN layer 8, p-type GaN layer 9, are used to form a double hetero combined structure. Further, a lower electrode 10 is partially formed to completely cover the entire underside surface of the Si substrate 2, while an upper electrode 11 is formed to partially cover an upper surface of the p-type GaN layer 9. In this way, when an electric voltage is applied to a position between the upper electrode 11 and the lower electrode 10, an electric current will flow from the upper electrode 11 into the InGaN layer 7 to cause it to emit a light, so that the light from the InGaN layer 7 is allowed to be emitted outwardly from an area not covered by the upper electrode 11 formed on the upper surface of the p-type GaN layer 9.

In this way, when a $SiO_2$ film 3 is formed by virtue of thermal oxidation on the Si substrate 2 and a ZnO film 4 is formed thereon, it was possible to obtain a Zno film 4 having a good c-axis orientation. As a result, it was able to effect an epitaxial growth of a crystal layer having a double hetero structure consisting of n-type GaN layer 5.

Further, even when the $SiO_2$ film 3 is formed not by virtue of thermal oxidation but by a sputtering method to form said film on the Si substrate 2 and subsequently a ZnO film 4 is formed thereon, one was able to obtain a ZnO film 4 having a good crystallinity.

In order to investigate the relationship between the presence of the $SiO_2$ film 3 on the Si substrate 2 and the crystallinity of the ZnO film 4, several samples were prepared to evaluate the quality of the crystallinity of the ZnO film 4 by investigating the half value width of rocking curve.

First Sample

At first, as a sample of the present invention, a $SiO_2$ film 3 having a thickness of 200 Å was formed on the Si substrate under the following condition A, are then ZnO film 4 having a thickness of 3500 Å was formed thereon.

Condition A:

Gas flow rate: 20 scam

Gas partial pressure ratio: $Ar/O_2=70/30$

Substrate heating temperature: 200 C

RF electric power: 350 W

Pressure: $1 \times 10^{-2}$ Torr

Next, as a sample of a prior art, a ZnO film having a thickness of 3500 Å was directly formed on the Si substrate. Subsequently, the half value widths of the rocking curves of ZnO film in both the sample of the present invention and the sample of the prior art were measured and it was found that the half value width of the rocking curve in the sample of the prior art was W=4.640°, while the half value width of the rocking curve in the sample of the present invention was W=3.74°.

Second Sample

At first, as a sample of the present invention, a $SiO_2$ film 3 having a thickness of 500 Å was formed on the Si substrate under the following condition B, and then a ZnO film 4 having a thickness of 3500 Å was formed thereon.

Condition B:

Gas flow rate: 20 scam

Gas partial pressure ratio $(Ar/O_2):=70/30$

Substrate heating temperature: 230 C

RF electric power: 350 W

Pressure : $1 \times 10^{-2}$ Torr

Next, as a sample of a prior art, a ZnO film having a thickness of 3500 Å was directly formed on the Si substrate. Then, the half value widths of the rocking curves of ZnO films in both the sample of the present invention and the sample of the prior art were measured and it was found that the half value width of the rocking curve in the sample of the prior art was W=4.31°, while the half value width of the rocking curve in the sample of the present invention was W=3.11°.

Third Sample

At first, as a sample of the present invention, a $SiO_2$ film 3 having a thickness of 1000 Å was formed on the Si substrate under the following condition C, and then a ZnO film having a thickness of 3500 Å was formed thereon.

Condition C:

Gas flow rate: 20 sccm

Gas partial pressure ratio: $Ar/O_2 =70/30$

Substrate heating temperature: 260 C

RF electric power: 350 W

Pressure: $1 \times 10^{-2}$ Torr

Next, as a sample of a prior art, a ZnO film having a thickness of 3500 Å was directly formed on the Si substrate. Then, the half value widths of the rocking curves of ZnO film in both the sample of the present invention and the sample of the prior art were measured and it was found that the half value width of the rocking curve in the sample of the prior art was W=3.84°, while the half value width of the rocking curve in the sample of the present invention was W=2.661°.

These samples and the measurement results of their rocking curve half value widths are and indicated in the following Table 1.

TABLE 1

| Sample | Thickness of SiO2 Film | Thickness of ZnO Film | Condition | Rocking Curve Half Value Width |
|---|---|---|---|---|
| 1 | 200Å | 3500Å | A | 3.74° |
|   | None | 3500Å | A | 4.640° |
| 2 | 500Å | 3500Å | B | 3.11° |
|   | None | 3500Å | B | 4.31° |
| 3 | 1000Å | 3500Å | C | 2.66° |
|   | None | 3500Å | C | 3.84° |

Figure 2:
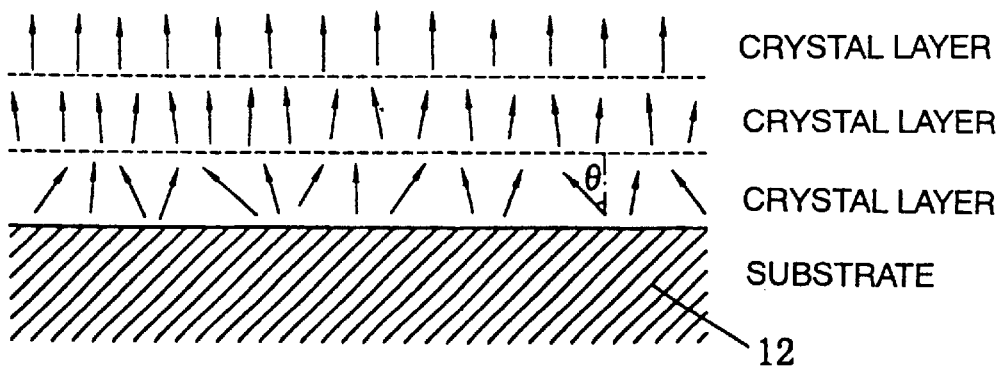
FIG. 2 is an explanatory view schematically indicating a change of crystals grown on a substrate in the direction of the crystal axis.

Next, an explanation will be given to the rocking curve half value width W used for evaluating a c-axis orientation. As shown in FIG. 2, when ZnO film is allowed to grow on the substrate, the initially formed crystal layers show that their crystal axis directions (shown by arrows) are random and not uniform because these crystal layers are not lattice conformable with the substrate. The crystal axis directions gradually become the same as one another when the crystal layers are laminated one upon another. Further, when a random extent in the crystal axial direction of a thin crystal film is to be evaluated, an X-ray diffraction apparatus may be used to measure the rocking curve. Namely, an X-ray is projected onto a test substrate, and a reflected light is detected by a light detector under conditions that the incident angle is being changed relatively with respect to the test substrate.

To be explained in more detail, where the position of the X-ray is fixed, the test substrate is caused to rotate around a rotating axis arranged to be parallel to the test substrate such that the normal vertical line of the test substrate may be changed in its direction. At the same time, the position of the detector is also rotated in accordance with the rotation of the test substrate in a manner such that a light directly reflected from the test substrate may be detected by the detector. In this way, the intensity of the reflected light may be detected while at the same time changing the angle of the test substrate. At this moment, an angle formed between the incident light and the reflected light once an output signal of the detector arrives at its peak value is defined as $2\theta_1$, while in ZnO orientated along the c-axis the angle will be in its peak when an angle $2\theta_p$ is 34.4°. Subsequently, the position of the X-ray is fixed and the detector is fixed at a peak position, so as to rotate solely the test substrate in the vicinity of the peak position and thus measure the intensity of the X-ray.

Figure 3:
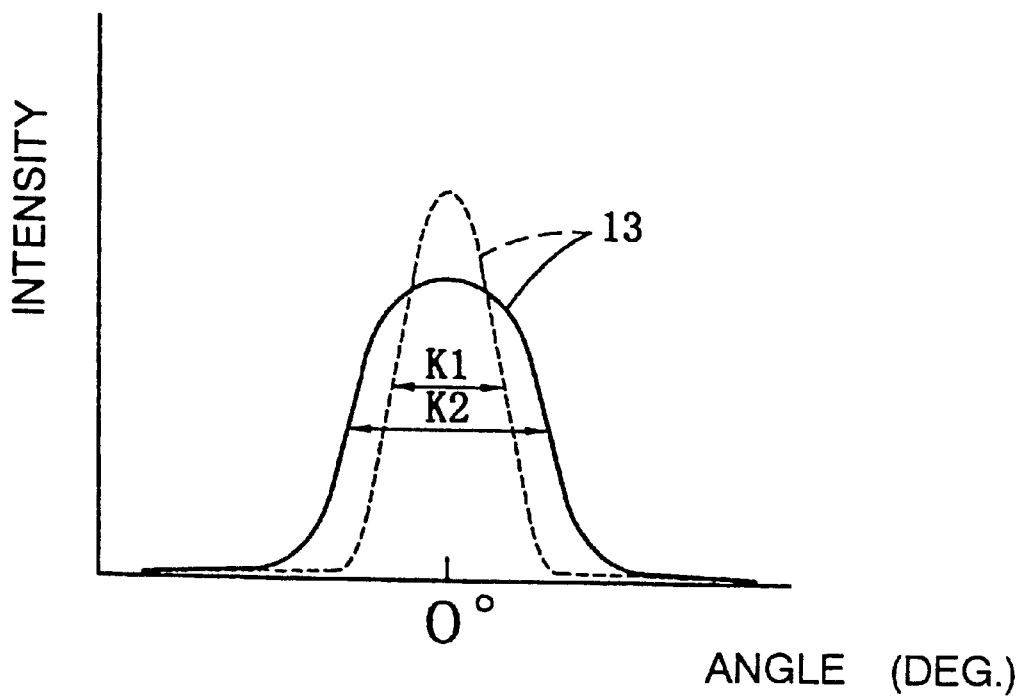
FIG. 3 is an explanatory graph indicating a rocking curve.

A distribution of the X-ray thus obtained is a rocking curve, and the position where the detector has been fixed is $\theta_p=17.2°$. Here, a deviation of the peak of a measured rocking curve away from an angle of 17.2° will become an inclination of c-axis of the ZnO film. A distribution of the X-ray intensity represented by a relative angle obtained by replacing the peak position (17.2°) with 0°, will become a rocking curve 12 as shown in FIG. 3. In FIG. 3, the horizontal axis is used to present the angle (an inclination) of c-axis, while the vertical axis is used to represent the intensity. Whether there is a good crystal orientation of the crystals laminated on the substrate 12 may be evaluated by observing a half value width (also referred to as a full width at half maximum or as FWHM by abbreviation) of the rocking curve 13. Namely, when the crystals are considerably irregular in their axial directions, the rocking curve 13 will change in a gentle manner and its half value width K2 will become wider, as shown by a solid line in FIG. 3. On the other hand, when the crystals are uniform in their axial directions, the rocking curve 13 will change in a sudden manner and its half value width K1 will become narrow, as shown by a broken line in FIG. 3.

Therefore, as may be understood from the measurement results in Table 1, by providing a $SiO_2$ film 3 on the Si substrate and further forming a ZnO film thereon, it is possible to obtain a ZnO film having a good c-axis orientation.

Figure 4:
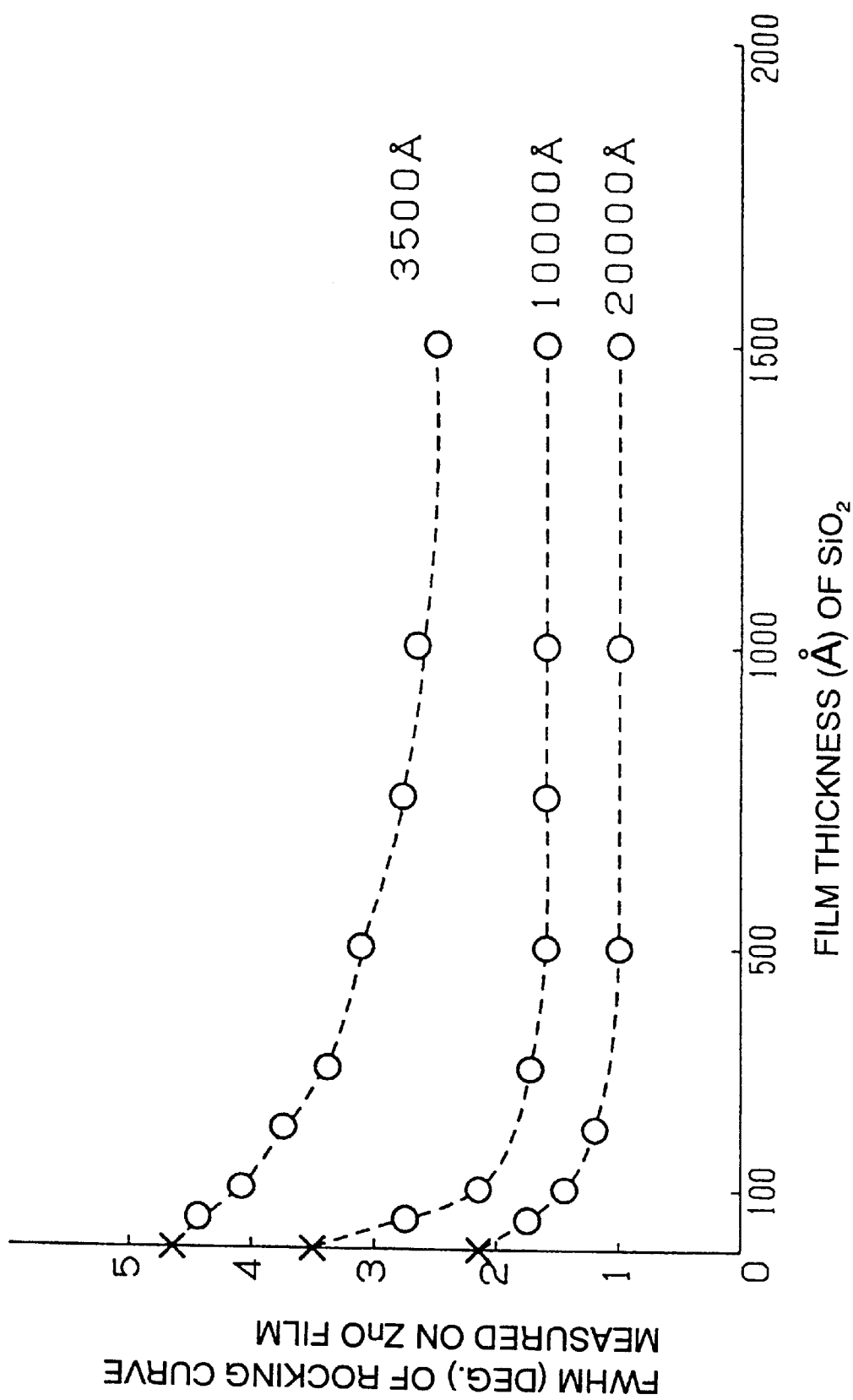
FIG. 4 shows measurement data indicating a relationship between the thickness of $SiO_2$ film and rocking curve half value width of ZnO film.

Next, an investigation was conducted into a relationship between the thickness of the $SiO_2$ film 3 and the c-axis orientated film all formed on the Si substrate. FIG. 4 is used to indicate measurement results of rocking curve half value width of the ZnO film under a condition where the thickness of $SiO_2$ is changed in a range of 0 –1500 Å, thereby forming ZnO films of 3500 Å, 10000 Å, 20000 Å, respectively. As can be understood from such measurement results, when the thickness of $SiO_2$ film 3 is made larger, the rocking curve half value width of the ZnO film will become smaller without depending upon the thickness of the ZnO film (in particular, when the thickness thereof is 3500–20,000 Å), thereby proving that the c-axis orientation of the ZnO film will be in a good condition. Further, once the thickness of the $SiO_2$ film 3 exceeds about 100 Å, the rocking curve half value width will suddenly become small irrespective of the thickness of the ZnO film. Therefore, by setting the thickness of $SiO_2$ film 3 at a value of about 100 Å or more, it is possible to obtain a $SiO_2$ film 3 having a good c-axis orientation. In addition, when the thickness of the $SiO_2$ film 3 exceeds about 300 Å, the rocking curve half value width will become saturated so as to be in a stabilized state, irrespective of a thickness of the ZnO film. For this reason, by setting the thickness of $SiO_2$ film 3 at a value of about 300 Å or more, it is possible to obtain a $SiO_2$ film 3 having a good c-axis orientation, and thus obtaining uniform characteristics. Therefore, the thickness of $SiO_2$ film 3 is preferred to be set at a value of about 100 Å or more, particularly at a value of about 300 Å or more.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method of manufacturing a semiconductor photonic device comprising:

forming a SiO2 film to a thickness of at least about 100 Å on a Si substrate;

forming a ZnO film on the $SiO_2$ film by sputtering; and forming a semiconductor compound layer represented by $In_xGa_yAl_zN$ wherein $x+y+z=1$, $0 \leq x \leq 1$, $0 \leq y \leq 1$, $0 \leq z \leq 1$ in communication with the ZnO film.

2. The method of manufacturing a semiconductor photonic device according to claim 1, wherein the $SiO_2$ film is formed to a thickness of at least about 300 Å.

3. The method of manufacturing a semiconductor photonic device according to claim 2, wherein the $SiO_2$ film is formed by thermal oxidization.

4. The method of manufacturing a semiconductor photonic device according to claim 2, wherein the $SiO_2$ film is formed by physical deposition.

5. The method of manufacturing a semiconductor photonic device according to claim 2, wherein the $SiO_2$ film is formed at a temperature of 200 to 260° C.

6. The method of manufacturing a semiconductor photonic device according to claim 2, wherein the $SiO_2$ film is formed by sputtering.

7. The method of manufacturing a semiconductor photonic device according to claim 1, wherein the $SiO_2$ film is formed by thermal oxidization.

8. The method of manufacturing a semiconductor photonic device according to claim 1, wherein the SiO2 film is formed by physical deposition.

9. The method of manufacturing a semiconductor photonic device according to claim 1, wherein the $SiO_2$ film is formed at a temperature of 200 to 260° C.

10. The method of manufacturing a semiconductor photonic device according to claim 1, wherein the $SiO_2$ film is formed by sputtering.

11. A method of manufacturing a semiconductor photonic device comprising:

forming a $SiO_2$ film on a Si substrate by thermal oxidization, physical deposition or sputtering;

forming a ZnO film on the $SiO_2$ film by sputtering; and forming a semiconductor compound layer represented by $In_xGa_yAl_zN$ wherein $x+y+z=1$, $0 \leq x \leq 1$, $0 \leq y \leq 1$, $0 \leq z \leq 1$ in communication with the ZnO film.

12. A method of manufacturing a semiconductor photonic device comprising:

forming a $SiO_2$ film on a Si substrate at a temperature of 200 to 260° C.;

forming a ZnO film on the $SiO_2$ film by sputtering; and forming a semiconductor compound layer represented by $In_xGa_yAl_zN$ wherein $x+y+z=1$, $0<x<1$, $0<y<1$, $0<z<1$ in communication with the ZnO film.

* * * * *